United States Patent
McCollum

(10) Patent No.: US 9,306,573 B2
(45) Date of Patent: Apr. 5, 2016

(54) APPARATUS AND METHOD FOR DETECTING AND PREVENTING LASER INTERROGATION OF AN FPGA INTEGRATED CIRCUIT

(71) Applicant: Microsemi SoC Corporation, San Jose, CA (US)

(72) Inventor: John L. McCollum, Orem, UT (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/790,982

(22) Filed: Jul. 2, 2015

(65) Prior Publication Data

US 2016/0020772 A1    Jan. 21, 2016

Related U.S. Application Data

(60) Provisional application No. 62/026,718, filed on Jul. 21, 2014.

(51) Int. Cl.
*H03K 19/177* (2006.01)

(52) U.S. Cl.
CPC ............................ *H03K 19/17768* (2013.01)

(58) Field of Classification Search
CPC ................................................ H03K 19/17768
USPC ...................................................... 326/8, 38
See application file for complete search history.

(56) References Cited

U.S. PATENT DOCUMENTS

| | | | |
|---|---|---|---|
| 8,890,205 B2* | 11/2014 | Kuenemund | G06F 21/558 257/111 |
| 9,052,345 B2* | 6/2015 | Lisart | H01L 23/576 |
| 2006/0081912 A1* | 4/2006 | Wagner | G06K 19/07372 257/316 |
| 2007/0171588 A1* | 7/2007 | Gehle | H01L 23/576 361/56 |
| 2009/0251168 A1* | 10/2009 | Lisart | H01L 23/576 326/8 |
| 2011/0080190 A1* | 4/2011 | Fornara | H01L 21/26506 326/8 |
| 2013/0314121 A1* | 11/2013 | Mougin | G06F 21/75 326/8 |
| 2014/0077835 A1* | 3/2014 | Amanuma | G06F 21/75 326/8 |
| 2015/0028917 A1* | 1/2015 | Kuenemund | G06F 21/558 326/8 |

* cited by examiner

*Primary Examiner* — Don Le
(74) *Attorney, Agent, or Firm* — Leech Tishman Fuscaldo & Lampl; Kenneth D'Alessandro, Esq.

(57) ABSTRACT

A circuit internal to a programmable integrated circuit for preventing laser interrogation of the programmable integrated circuit includes a sense resistor connected between a deep n-well and a source of bias voltage for the deep n-well. A voltage-sensing circuit is coupled across the sense resistor to measure voltage across the sense resistor. A tamper trigger circuit responsive to the voltage sensing circuit generates a tamper signal in response to a voltage sensed in the voltage sensing circuit having a magnitude greater than a threshold value.

7 Claims, 2 Drawing Sheets

APPARATUS AND METHOD FOR DETECTING AND PREVENTING LASER INTERROGATION OF AN FPGA INTEGRATED CIRCUIT

This application claims the benefit of U.S. Provisional Patent Application No. 62/026,718 for "Apparatus and Method for Detecting and Preventing Laser Interrogation of an FPGA Integrated Circuit" filed Jul. 21, 2014, the contents of which are incorporated in this disclosure by reference in their entirety.

BACKGROUND OF THE INVENTION

1. Field of the Invention

The present invention relates to integrated circuits. More particularly, the present invention relates to programmable logic devices and to Field programmable Gate Array (FPGA) integrated circuits.

Field Programmable Gate Arrays (FPGAs) are typically used in secure systems because the design is implemented by the user not the wafer manufacturer, making it more difficult for an attacker to understand the internal function programmed into the device. However, increasingly sophisticated techniques have been developed to determine the design that has been programmed into the FPGA. One of these techniques involves shining a laser through the backside of the die to sense the effect on the transistors.

2. Description of Related Art

Laser light stimulation of transistors has been used for many years to analyze integrated circuits. However, modern integrated circuits utilize very dense metal with as many as 12 metal layers. This prevents light from reaching the transistors from the top. As a result, techniques have been developed to shine light from the backside of the integrated circuit and therefore must use infrared light, as silicon is opaque to visible light, but transparent to infrared light. The infrared light must be reasonably intense to stimulate the transistor due to absorption by the bulk silicon and to be strong enough to cause a measurable effect on the transistor to analyze its function.

There are two different phenomena that can be used in this analysis. First, the infrared light can be used to heat the transistor significantly (tens of degrees Celsius) thereby slowing it down which can be seen as a change in the power consumption at the specific time that it switches, thereby giving clues to an attacker concerning what is happening in the circuit. Second, infrared light can be used to switch the state of a register by inducing a photo current by double photon absorption, thereby altering the decision made by the circuit. The state change of the register can be sensed by the attacker. In the event that the register contains a bit of an encryption key, the attacker obtains one of the bits of the key. By repeating the process, an attacker can read many or all bits in the encryption key thus gaining access to the internal configuration information for the circuit. In other cases, flipping the state of a register may enable readout of otherwise unavailable information, thus potentially giving the attacker access to the configuration information for the integrated circuit.

There is no prior art known to the inventor for dealing with this problem.

SUMMARY OF THE INVENTION

This intense infrared laser light used to interrogate the circuit must first pass through the well isolating the transistor from the bulk silicon. This will induce a photocurrent in the well. Since the isolating well is not used in the circuit path, the current flowing between the well and the power supply rail (e.g., +2.5V) to which it is connected is normally in the picoampere range due to junction leakage. The induced photocurrents will increase the current in the well many thousands of times, making it easily detectable. In accordance with the present invention, current flowing from the power supply to the deep n-well is monitored. In one embodiment of the invention, the current is monitored by a resistor placed between the power supply and the deep n-well. Detection of this current at a level significantly higher than the quiescent current level is sensed and will trigger a logic signal. The logic signal is used to either disable at least one function of the integrated circuit or to erase the configuration memory defining the function of the integrated circuit.

Further details and advantages of the invention will become clear upon reading the following detailed description in conjunction with the accompanying drawing figures, wherein like parts are designated with like reference numerals throughout.

DESCRIPTION OF THE INVENTION

In the following description, numerous specific details are set forth in order to provide a more thorough description of the present invention. It will be apparent, however, to one skilled in the art, that the present invention may be practiced without these specific details. Other embodiments of the invention will readily suggest themselves to such skilled persons having the benefit of this disclosure. In some instances, well-known features have not been described in detail so as not to obscure the invention.

Figure 1:
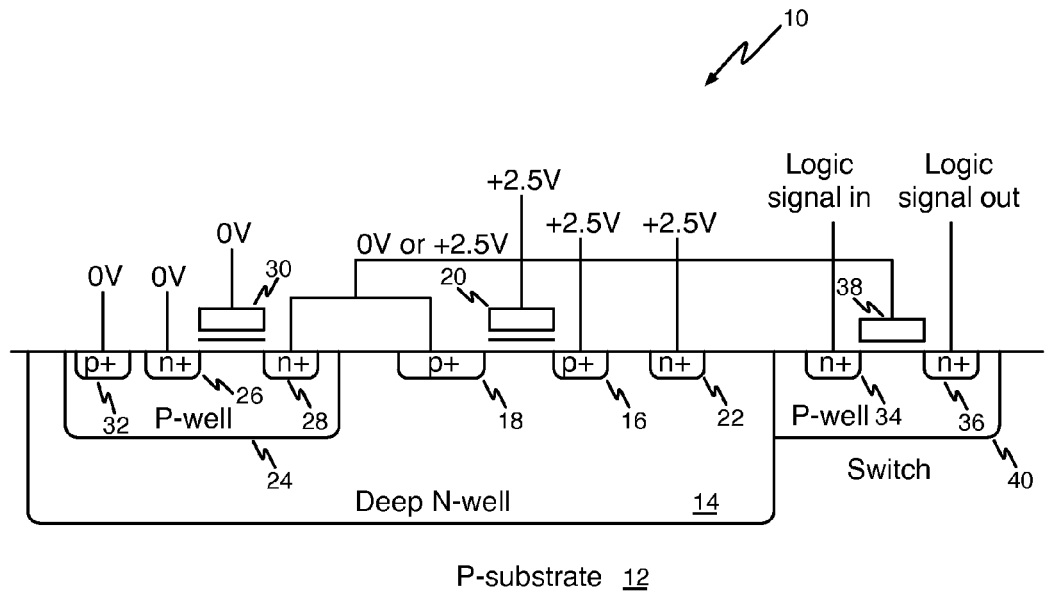
FIG. 1 is a diagram showing a cross-sectional view of a typical configuration memory cell utilized in one embodiment of an NVM FPGA integrated circuit.

Referring first to FIG. 1, diagram shows a cross-sectional view of a typical configuration memory cell 10 utilized in an FPGA integrated circuit. Configuration memory cell 10 is formed in a p-type semiconductor substrate 12. A deep n-well 14 is formed in p-type substrate 12, and the p-substrate 12 is connected to ground (0V), it being understood that any common potential may be utilized in place of ground, with the relative voltages to the common potential substituted for the ground relative voltages described herein.

A p-channel non-volatile transistor is formed in the deep n-well 14 and includes a source 16, a drain 18, and a gate 20. An n+ contact 22 is used to place a voltage bias on the deep n-well 14. During normal operation of the memory cell 10, the source 16 of the p-channel non-volatile transistor and the deep n-well 14 are both connected to a positive voltage (e.g., +2.5V).

An n-channel non-volatile transistor is formed in a p-well 24, with the p-well 24 formed within the deep n-well 14, and includes a source 26, a drain 28, and a gate 30. A p+ contact 32 is used to place a voltage bias on the p-well 24. During normal operation of the memory cell 10, the source 26 of the n-channel non-volatile transistor and the p-well 24 are connected to ground (0V).

A switch transistor having a source 34, a drain 36, and a gate 38 is formed in a p-well 40 in the p-type substrate 12. The drains 18 and 28 of the p-channel and n-channel non-volatile transistors are connected together and to the gate 38 of the switch transistor. The source 34 and drain 36 of the switch transistor are respectively connected to logic circuitry in the FPGA fabric as is known in the art, and respectively denoted as Logic Signal Out and Logic Signal In.

During normal operation of the FPGA integrated circuit, the deep n-well 14 is reverse biased with respect to both the p-type substrate 12 and the p-well 24 contained within the deep n-well 14 and only a small leakage current on the order of a few picoamperes flows from the power supply to the deep n-well through contact 22. In the event that a laser is used to attempt to discern the circuit programmed into the FPGA, large minority carrier photocurrents (on the order of several microamperes) will be induced in the deep n-well 14, and will be collected in the power rail connected to the deep n-well 14 through contact 22.

Figure 2:
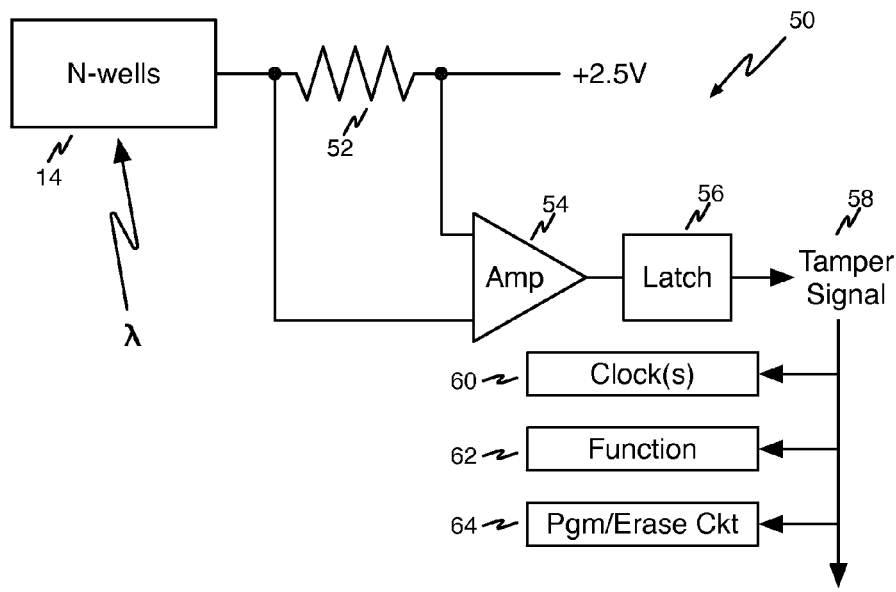
FIG. 2 is a diagram showing one aspect of preventing laser interrogation of an FPGA integrated circuit according to the present invention.

Referring now to FIG. 2, a diagram shows an illustrative circuit 50 embodying one aspect of detecting and preventing laser interrogation of an FPGA integrated circuit according to the present invention. In the circuit of FIG. 2, the positive voltage of +2.5V is connected to the deep n-wells 14 though a sense resistor 52. As previously noted, during normal circuit operation very little current flows through sense resistor 52, dropping only a small voltage across the sense resistor 52. A sense amplifier 54 monitors the voltage across the sense resistor 52. When the voltage across sense resistor 52 reaches a value set to sense photocurrent generated by laser probing of the integrated circuit, sense amplifier 54 trips and sets latch 56. The output of latch 56 is a tamper signal 58. In an embodiment of the invention where the power supply is at a voltage of +2.5V, the resistor may have a value of between about 1K Ohms and about 100K Ohms, and the sense amplifier may trigger at voltage values of between about 0.01V and about 0.3V.

As shown in FIG. 2, the tamper signal 58 can be used to disable at least one function of the integrated circuit, for example, stopping all of the clocks in the circuit, as shown at reference numeral 60, or performing a function 62, such as interrupting the voltage supply to some or all of the circuit. The tamper signal 58 can also be used to trigger an erase operation of the configuration memory, as shown at reference numeral 64. In any of these cases, the would-be tamperer is rendered unable to discern the configuration information for the FPGA.

The foregoing description of the invention is in the context of deep n-wells. As will be readily appreciated by persons of ordinary skill in the art, the present invention can be used on regular logic n-wells as well as any deep n-well used to isolate p-wells, or on isolated p-wells.

Figure 3:
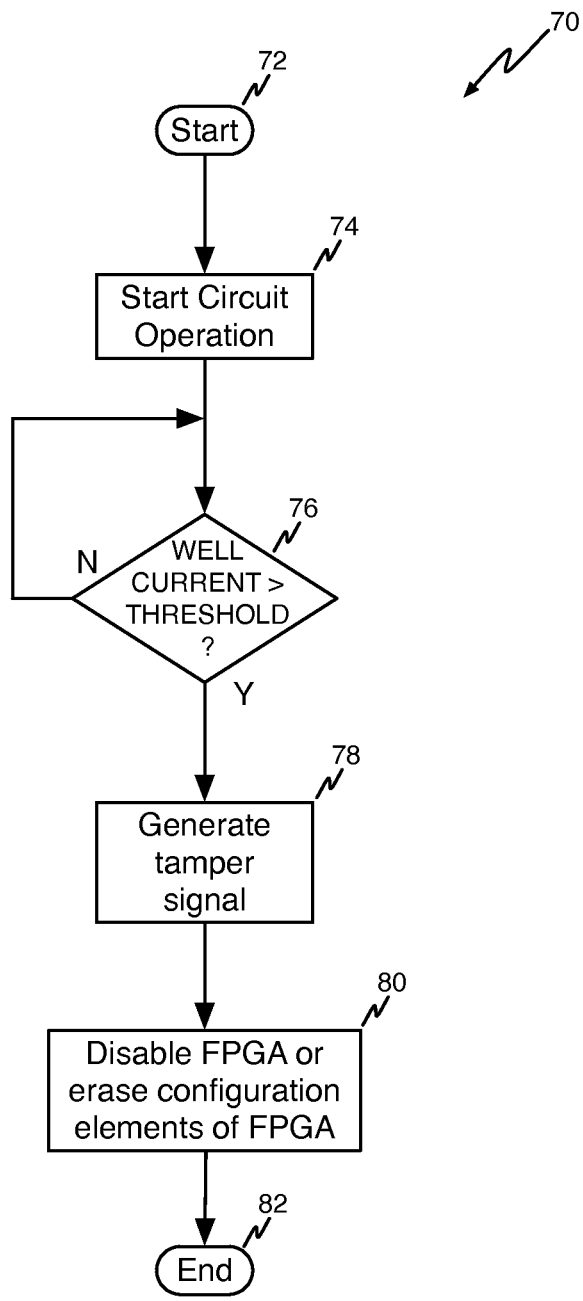
FIG. 3 is a flow diagram illustrating a method for preventing laser interrogation of an FPGA integrated circuit according to the present invention.

Referring now to FIG. 3, a flow diagram shows an illustrative method 70 for detecting and preventing laser interrogation of an FPGA integrated circuit according to the present invention.

The method starts at reference numeral 72. At reference numeral 74, operation of the integrated circuit begins. At reference numeral 76, the method enters a current-sensing loop monitoring the current through the sense resistor 52 of FIG. 2. As long as the current through sense resistor 52 is below the threshold, the method remains in the current-sensing loop at reference numeral 76.

If the current through sense resistor 52 exceeds the threshold, the method proceeds to reference numeral 78, where a tamper signal is generated by sense amplifier 54 tripping and setting latch 56 of FIG. 2. The method then proceeds to reference numeral 80 where the operation of the integrated circuit such as an FPGA, is disabled or the configuration memory is erased, depending on the intent of the designer. The integrated circuit may be disabled by stopping all of the clocks in the circuit, or by interrupting the voltage supply to some or all of the integrated circuit. The tamper signal 58 output by latch 56 of FIG. 2, thus may be utilized as a disable command for the integrated circuit or to instruct the programming intelligence on the integrated circuit to perform an erase operation on the configuration memory. The method ends at reference numeral 82. The above is particularly described in relation to an FPGA, it being understood that the principles are equally applicable to any integrated circuit and are thus not limited to an FPGA.

Although the above provides a full and complete disclosure of the preferred embodiments of the invention, various modifications, alternate constructions and equivalents will occur to those skilled in the art. Therefore, the above should not be construed as limiting the invention, which is defined by the claims.

The invention claimed is:

1. A circuit internal to a programmable integrated circuit for preventing laser interrogation of the programmable integrated circuit and comprising:
   a deep n-well containing transistors in the programmable integrated circuit formed on a p-type substrate;
   a source of bias voltage for the deep n-well, the bias voltage arranged to provide a reverse bias for the n-well in respect to the p-type substrate;
   a sense resistor connected between the deep n-well and the source of bias voltage;
   a voltage-sensing circuit coupled across the sense resistor to measure voltage across the sense resistor; and
   a tamper trigger circuit responsive to the voltage sensing circuit to generate a tamper signal in response to a voltage sensed in the voltage sensing circuit having a magnitude greater than a threshold value.

2. The circuit of claim 1, further comprising a disable circuit responsive to the tamper signal by disabling at least one function of the programmable integrated circuit.

3. The circuit of claim 1, further comprising:
   program and erase circuitry on the integrated circuit configured to program and erase configuration elements on the programmable integrated circuit, the program and erase circuitry on the integrated circuit configured to erase the configuration elements in response to the tamper signal.

4. A method for preventing laser interrogation of the programmable integrated circuit and comprising:
   measuring current flowing between a deep-n-well in the integrated circuit and a voltage bias source for the deep n-well in the integrated circuit;
   generating a tamper signal when the current flowing between the deep-n-well and the voltage bias source for the deep n-well exceeds a threshold value; and
   causing an anti-tampering action in the integrated circuit in response to the tamper signal.

5. The method of claim 4, wherein causing an anti-tampering action in the integrated circuit in response to the tamper signal comprises disabling at least one clock circuit in the programmable integrated circuit.

6. The method of claim 4, wherein causing an anti-tampering action in the integrated circuit in response to the tamper signal comprises disabling at least one function of the programmable integrated circuit.

7. The method of claim 4, wherein causing an anti-tampering action in the integrated circuit in response to the tamper signal comprises erasing a configuration memory in the integrated circuit.

* * * * *